(12) United States Patent
Min

(10) Patent No.: US 7,929,370 B2
(45) Date of Patent: Apr. 19, 2011

(54) SPIN MOMENTUM TRANSFER MRAM DESIGN

(75) Inventor: Tai Min, Milpitas, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 347 days.

(21) Appl. No.: 12/313,708

(22) Filed: Nov. 24, 2008

(65) Prior Publication Data

US 2010/0128518 A1 May 27, 2010

(51) Int. Cl.
*G11C 11/06* (2006.01)
(52) U.S. Cl. ......... 365/225.5; 365/48; 365/97; 365/130; 365/171
(58) Field of Classification Search ............... 365/225.5, 365/48, 97, 130, 171
See application file for complete search history.

(56) References Cited

U.S. PATENT DOCUMENTS

| | | | |
|---|---|---|---|
| 6,130,814 | A | 10/2000 | Sun |
| 6,665,155 | B2 | 12/2003 | Gill |
| 6,958,927 | B1 | 10/2005 | Nguyen et al. |
| 7,227,773 | B1 | 6/2007 | Nguyen et al. |
| 7,286,395 | B2 | 10/2007 | Chen et al. |
| 2004/0066668 | A1* | 4/2004 | Gider et al. ............... 365/171 |
| 2007/0063237 | A1 | 3/2007 | Huai et al. |
| 2008/0102315 | A1 | 5/2008 | Fukuzawa et al. |

OTHER PUBLICATIONS

"A Novel Nonvolatile Memory with Spin Torque Transfer Magnetization Switching: Spin-RAM," by Hosomi et al., IDEM, 2005, 4 pages.
"Current-driven excitation of magnetic multilayers," by Slonczewski, Journal of Magnetism and Magnetic Materials, vol. 159, pp. L1-L7, 1996.
"Multilayer configuration for experiments of spin precession induced by a dc current," by L. Berger, Journal of Applied Physics, vol. 93, No. 10, May 15, 2003, pp. 7693-7695.

* cited by examiner

*Primary Examiner* — Huan Hoang
*Assistant Examiner* — Jason Lappas
(74) *Attorney, Agent, or Firm* — Saile Ackerman LLC; Stephen B. Ackerman

(57) ABSTRACT

We describe the structure and method of formation of a STT MTJ or GMR MRAM cell element that utilizes transfer of spin torque as a mechanism for changing the magnetization direction of a free layer. The critical current is reduced by constructing the free layer as a lamination comprising two ferromagnetic layers sandwiching a coupling valve layer. When the Curie temperature of the coupling valve layer is above the temperature of the cell, the two ferromagnetic layers are exchange coupled in parallel directions of their magnetization. When the coupling valve layer is above its Curie temperature, it no longer exchange couples the layers and they are magnetostatically coupled. In the exchange coupled configuration, the free layer serves to store data and the cell can be read. In its magnetostatically coupled configuration, the cell can be more easily written upon because one of the layers can assist the spin torque transfer by its magnetostatic coupling. If the free layer is formed as a multi-layered lamination of N periodically repeating combinations of a ferromagnetic layer and a coupling valve layer, the critical current can be reduced by a factor of N.

51 Claims, 6 Drawing Sheets

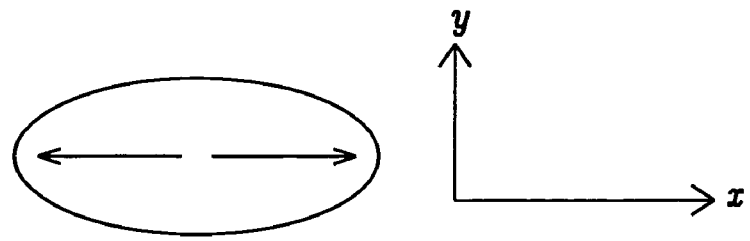
FIG. 1a - Prior Art
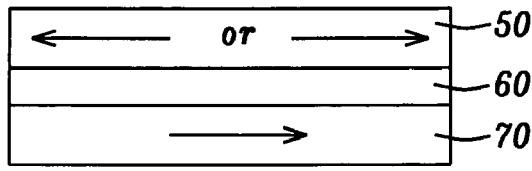
FIG. 1b - Prior Art
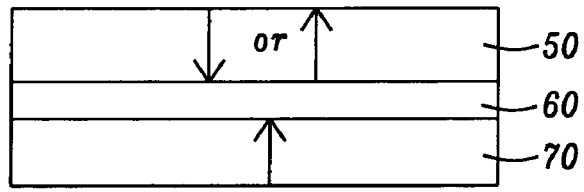
FIG. 2 - Prior Art
Resistance vs. External Field
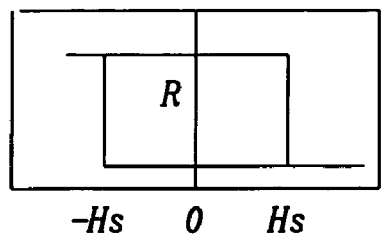
FIG. 3 - Prior Art

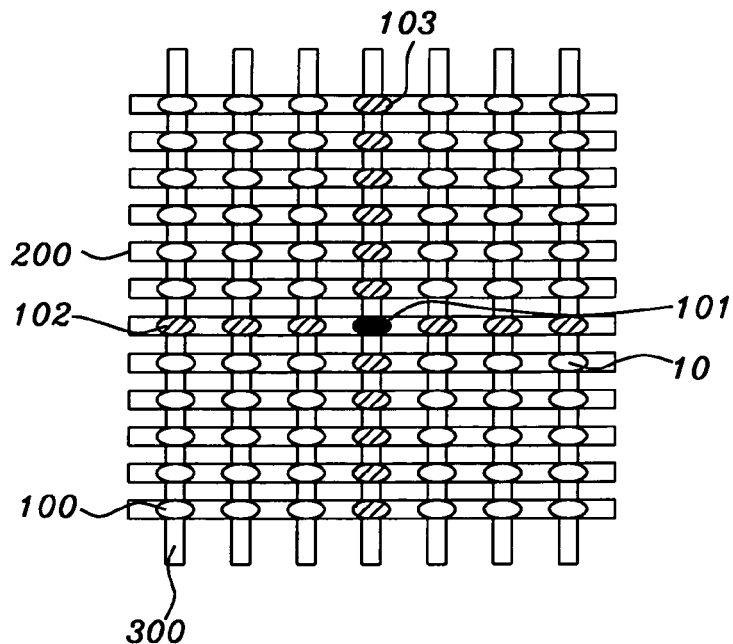
FIG. 4 — Prior Art
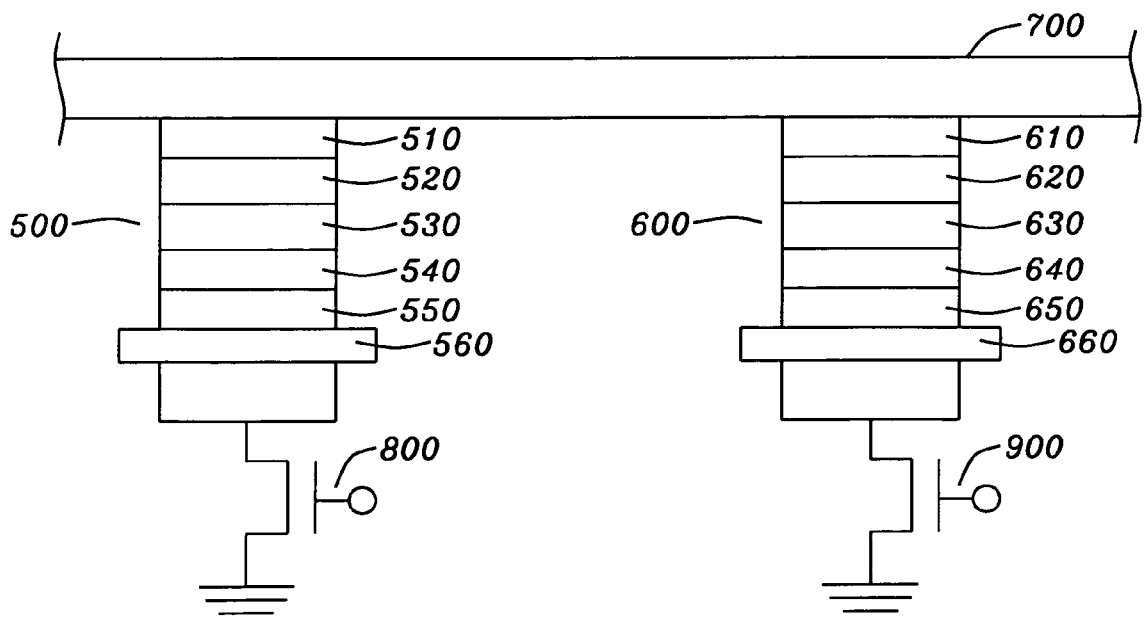
FIG. 5 — Prior Art

SPIN MOMENTUM TRANSFER MRAM DESIGN

BACKGROUND OF THE INVENTION

1. Field of the Invention

This invention relates generally to a spin momentum transfer random access memory (SMT-MRAM) cell formed in either a magnetic tunneling junction (MTJ) or GMR Spin Valve (SV) configuration, using a spin momentum transfer (SMT) effect to change the magnetization of a free layer. In particular, it relates to a free layer design to enhance the properties of such a cell.

2. Description of the Related Art

The conventional magnetic tunneling junction (MTJ) or GMR Spin Valve (GMR/SV) device is a form of ultra-high magnetoresistive (MR) device in which the relative orientation of the magnetic moments of parallel, vertically separated magnetized layers, controls the flow of spin-polarized electrons tunneling either through a very thin dielectric layer (in the MTJ case) or through a thin conducting layer of a transitional metal (in the GMR/SV case) formed between those layers.

When injected electrons pass through the upper magnetized layer they are spin polarized by interaction with the magnetic moment of that layer. The majority of the electrons emerge polarized in the direction of the magnetic moment of the upper layer, the minority being polarized opposite to that direction. The probability of such a polarized electron then tunneling through the intervening tunneling barrier layer into the lower layer then depends on the availability of quantum states within the lower layer that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of multi-state resistor, since different relative orientations (e.g. parallel and antiparallel) of the magnetic moments will change the magnitude of a current passing through the device.

In the GMR/Spin Valve form, the electrons are still spin-polarized by passage through a first layer having its magnetization set in a given direction, but now there is no tunneling barrier layer to provide a transport probability and corresponding current variation. Instead, the two spin orientations of the electrons produced in the first layer have differing scattering cross-sections in the second layer, depending upon the magnetization direction of that second layer. Thus, whether the device is MTJ or GMR the resulting effect is to produce a variable resistance depending upon the relative orientations of layer magnetization.

In a common type of device configuration one of the magnetic layers has its magnetic moment fixed in spatial direction (the pinned or reference layer) by exchange coupling to an antiferromagnetic layer, while the other magnetic layer has its magnetic moment free to move (the free layer) in response to some external magnetic fields. When utilized as a magnetic storage device, the magnetic moment of the free layer is made to switch its direction from being parallel to that of the pinned layer, whereupon the tunneling current is large, to being anti-parallel to the pinned layer, whereupon the tunneling current is small. Thus, the device is effectively a two-state resistor. The switching of the free layer moment direction, called "writing," is accomplished by external magnetic fields that are the result of currents passing through conducting lines adjacent to the cell.

In MRAM applications, the magnetizations of the stack of magnetic layers, whether it be an MTJ or GMR/SV form (to be called more simply the SV form hereinafter), can have two basic configurations, depending on whether the magnetization of the layers is in the plane of the layers (in-plane) or perpendicular to the plane of the layers. For the in-plane configuration, the magnetizations of both the free and pinned layers will remain in the layer plane as shown in FIG. 1a and FIG. 1b.

Referring to FIG. 1a and FIG. 1b, there is shown a highly schematic drawing of a prior art exemplary MTJ cell (100). The cell is shown in an overhead (FIG. 1a) and side (FIG. 1b) cross-sectional view. In the overhead view, the cell is shown as having an elliptical horizontal cross-section, which is an advantageous shape for providing the magnetic layers with a shape induced magnetic anisotropy, which is a predisposition for the magnetization vector of the cell to lie along a particular direction. In this case, the predisposed direction is the major axis of the cell layer, which is then called the easy axis. Two arrows are drawn to represent two possible orientations of the magnetization of this particular cell layer along its easy axis, the assumption in this drawing being that the layer shown is the free layer, so the magnetization has the possibility of being in either direction along that axis. Note that the magnetization of the free layer could lie along other directions in the plane of the layer under certain circumstances, but the easy axis is the most stable and energetically preferable axis in the absence of external stimuli.

Referring now to FIG. 1b, there is shown a side cross-sectional view of the same cell as shown in FIG. 1a. The upper layer (50) is the free layer and the same two arrows are shown to indicate the two directions of magnetization along the easy axis. The lower layer (70) is the pinned layer and the magnetization is fixed (pinned) along its easy axis in a single direction. Typically, the pinning of such a layer is accomplished by interaction with adjacent layers that are not shown in this figure. The intermediate layer (60) is a tunneling barrier layer, which is a very thin dielectric layer through which electrons could pass by means of quantum mechanical tunneling.

Referring to FIG. 2 there is shown a side cross-sectional view of another cell configuration in which the magnetization directions are perpendicular to the planes of the cell layer. The free layer of this cell (50) has the two magnetizations shown as vertical arrows, while the pinned layer (70) has only one direction of its magnetization, indicated by a single upward arrow. In this perpendicular magnetization configuration, the predisposition to up and down orientations of the layer magnetization is not the result of shape anisotropy as in FIG. 1a, but would be provided by a crystalline anisotropy, the arrangement of the molecules in the layer resulting from applying a magnetic field during formation of the layer. The horizontal cross-section of this cell need not be elliptical and would probably be of some shape that does not compete with the vertical anisotropy.

The storage of digital information is provided by the orientation of the free layer magnetization, in-plane or perpendicular to the plane. Referring to FIG. 3, there is shown a schematic graph illustrating the resistance of such a cell (the cell of FIG. 1 or FIG. 2) as a result of an external field directed along the orientation of the pinned layer magnetization. Resistance is plotted vertically, field is plotted horizontally. When the field is off (zero field), the two states with minimum and maximum resistances correspond to the free layer magnetization being parallel to and anti-parallel to the pinned layer direction respectively. $H_s$ is defined as the switching field, which is the strength of the external field required to change the direction of the free layer magnetization. The magnitude of this field is determined by the anisotropy energy of the cell element.

FIG. 4 is a highly schematic drawing showing an overhead view of an array of conventional MRAM cells formed between orthogonal word (200) and bit (300) lines. Each cell (100) is drawn with a slightly elliptical horizontal cross-section because such a shape anisotropy produces a magnetic anisotropy within the free layer that assists its magnetic moment in retaining a thermally stable fixed position after switching fields have been turned off. According to the diagram, the word line field will be along the short or "hard" axis of the cell, the bit line field will be along the easy axis (the longer axis of the ellipse) along which the magnetic moment of the cell spontaneously forms.

As shown in the figure, in conventional MRAM applications two orthogonal external fields are used to program an MRAM cell in the array. These fields are generated by an orthogonal matrix of current carrying lines, the word (200) and bit (300) lines. The bit lines provides the easy axis fields (along the major axis of the ellipse) and the word lines provide the hard axis fields (along the minor axis of the ellipse). To program a cell (101), currents are applied to both its word and bit lines and the combined fields overcome the shape anisotropy of the cell which tends to maintain the direction of the cell's magnetic moment in the absence of external fields. The cell whose magnetization direction is to be changed is called the selected cell (101) and the intersection of currents in the lines above this cell cause its magnetic moment to change. To program a cell (set its magnetic moment direction), both word and bit lines that intersect its position carry a current. However, there are many other cells (102), (103) that separately lie beneath the bit and word lines that intersect at the selected cell and these cells are not intended to be programmed. These cells experience the magnetic fields of either the word line or the bit line separately, which produces a lesser effect than the combined fields at the intersection of the lines. However, these cells can still be accidentally programmed, causing an error. Such cells are referred to as half-selected cells. Another shortcoming of this approach to programming cells is a scaling difficulty: as cell dimensions become smaller, $H_s$ increases, requiring a higher current to produce the required switching.

The two shortcomings noted above, half-selected cells and increasing current requirements, can be avoided using the spin torque transfer (STT) switching mode. This mode is described in J. C. Slonczewski, "Current-driven excitation of magnetic multilayers," J. Magn. Magn. Mater., vol. 159, pp. L1-L7, 1996 and M. Hosomi et al., "A Novel Nonvolatile Memory with Spin Torque Transfer Magnetization Switching: Spin-RAM" IDEM, 2005. It is also to be found in Sun, et al., U.S. Pat. No. 6,130,814.

Referring to FIG. 5, a portion of an MRAM device is schematically illustrated. The device incorporates two exemplary spin torque transfer (STT) MTJ cell elements, (500) and (600), formed between a common bit line (700) and circuitry (800), (900) for accessing each cell and causing a current to pass through it. In this general form, the elemental cells could be MTJ or GMR, depending on the nature of the intermediate layer (530), (630).

Each cell element comprises a capping layer (510), (610) that electrically contacts the common bit line (700), a free layer (520), (620) having a magnetization that can be varied, a tunneling barrier layer (530), (630), which could be a conducting intermediate layer in the case of a GMR cell, a pinned layer (540), (640) having a magnetization direction that is fixed, a seed layer (550), (650) and a bottom electrode (560), (660). Also shown is an electrical connection to the bottom electrode and a control circuit element (800), (900) that enables a current to flow from the bit line, through the cell and to ground. It is noted that a cell element operating on the SV (spin valve) GMR effect rather than MTJ effect could also be used in such a circuit, but the MTJ tunneling barrier layers (530), (630) would be replaced by electrically conducting layers. The operation of the MRAM device is based on the fact that the free layers (520), (620) of the individual cell elements have a magnetization that can be directed either along the magnetization direction of their pinned layers or opposite to that fixed magnetization. Moreover, the circuitry enables the relative direction to be sensed, typically by a resistance measurement of the cell, so the relative direction can be used to define a logical 1 or 0. As long as the relative directions remain stable and unchanged, the cell element is said to be storing information. When the relative direction is sensed by the circuitry, the stored information is being read. To write information of the cell element, the present state of its magnetization must be reversed, which is accomplished by passing a current, the critical switching current $I_c$, through the cell.

The critical switching current, $I_c$, is given by:

$$I_c = CM_s^2 V, \tag{1}$$

Where C is a constant, $M_s$ is the spontaneous magnetization of the free layer of either cell (510), (610), V=At is the volume of each cell, where A is its horizontal cross-sectional area and t is the free layer thickness.

From equation (1), it is obvious that the switching current, $I_c$, scales according to the cell dimensions. However, as the cell dimensions become smaller, thermal agitation may perturb the stored information (i.e., change the magnetization of the free layer). The effect of thermal agitation is given by the equation:

$$f = f_0 \exp\{-BH_s M_s V/kT\}, \tag{2}$$

where f is the thermal switching frequency, $f_0$ and B are constants, k is Boltzmann's constant and T is the absolute temperature. For the stored information to be thermally stable (low switching frequency, f) the numerator of the exponentiated fraction, $BH_s M_s V$, must exceed a certain constant value. As the dimensions of the cell scale down, the area factor, A, in the volume V=At decreases, so to maintain the value of the numerator, $H_s$ and/or $M_s t$ must increase. But increasing $M_s t$ will increase $I_c$, which is undesireable. In addition, for a tunneling MTJ, the voltage across the dielectric layer is: $V_c = I_c R$, so it is important to have a low value of the critical switching current, $I_c$, to avoid the reliability concerns of dielectric breakdown. Thus it is a challenge to have a low value of $I_c$ for reliable writing, yet to maintain the thermal stability of stored data. For such reasons, a new STT-MRAM device configuration is proposed herein.

SUMMARY OF THE INVENTION

A first object of this invention is to provide a STT-MRAM device of the spin torque transfer (STT) variety, in either an MTJ or GMR configuration, in which the free layer responds differently during read operations and write operations so the critical switching current can be reduced.

A second object of the present invention is to provide such a device in which the free layer is a coupled tri-layer or multi-layer that is ferromagnetically exchanged coupled across an intermediate coupling layer or layers when the device stores data or is read and is magnetostatically coupled when the device is written upon.

A third object of the present invention is to provide such a coupled free layer wherein the coupling is varied in part by the action of a current passing from one layer of the tri-layer to the other layer.

A fourth object of the present invention is to provide such a coupled free layer wherein the coupling is varied by the change in temperature of a coupling valve layer.

A fifth object of the present invention is to provide such a variably coupled free layer whose critical current, $I_c$, can be further reduced by employing a coupled periodically laminated structure.

These objects will be met by a MRAM spin transfer device design in which the free layer of the STT MTJ or STT GMR cell is a tri-layered (FIG. 6a) or multi-layered, periodic lamination (FIG. 6b). In its simplest, tri-layered form, shown in FIG. 6a, the free layer (25) comprises, respectively, a first (20) and second (24) ferromagnetic data storage layer, separated by a coupling valve layer (22). This structure provides the free layer with the following property: during data storage, when the magnetization of the free layer must be stable, the two ferromagnetic storage layers, (20) and (24), are ferromagnetically exchange coupled by means of the coupling valve layer, with parallel magnetizations directed along the same direction, so that the two layers act like a single layer of combined magnetization. During the writing operation, however, the coupling valve layer no longer acts to produce an exchange coupling and now the two ferromagnetic storage layers (20), (24) are more weakly magnetostatically coupled in a configuration that favors an anti-parallel configuration of their respective magnetic moments. This weaker magnetostatically coupled state will allow the free layer magnetization to be reversed by means of a smaller critical switching current than would otherwise be needed.

Referring to FIG. 6b, there is shown a cell with the same basic free layer (25), intermediate layer (26) and pinned layer (27) as shown in FIG. 6a, but the free layer (25) is a periodic lamination of four [ferromagnetic layer/coupling valve layer] laminates, labeled (251), (252), (253) and (254) and an additional ferromagnetic layer (255) adjacent to the intermediate layer (26) to complete the periodic structure. This structure would reduce the required switching current by an additional factor of one fourth.

This laminated, variably coupled free layer (25), in either FIG. 6a or FIG. 6b, is separated from a reference (pinned) layer (27) by a tunneling barrier layer (26), if the cell is an MTJ cell, or by a conducting intermediate layer, if the cell is to operate as a GMR cell.

Referring back to both FIG. 5 and FIG. 6a, the switching process produced by the action of the coupling valve layer (22), as it changes the nature of the free layer between the strong ferromagnetic exchange coupling and the weaker magnetostatic coupling, can be explained as follows. By the process of self-heating, a writing current passing from the bit line (see (700) in FIG. 5) to ground (see (800) and (900) in FIG. 5), i.e., a flow of electrons moving upward through the pinned layer towards the free layer, generates sufficient heat (primarily in the resistive tunneling layer (26) of the MTJ cell) to raise the temperature of the cell. The coupling valve layer (22), in this example, is a layer of magnetic material with a low Curie temperature, $T_c$, so that when the cell temperature exceeds the Curie temperature the coupling valve layer becomes paramagnetic and the exchange coupling is reduced to zero. At that point, the writing spin current need only be sufficient to switch the magnetization of the second storage layer (24) with the magnetostatic assistance of the magnetic field of the magnetization of the first storage layer (20). Once the magnetization of layer (24) has been switched, the spin current will supply a sufficient magnetic torque to switch the magnetization direction of layer (20).

Said in another way, referring now to FIG. 7a, assume the MTJ cell has an in-plane magnetization configuration, and that the initial magnetizations of the ferromagnetically exchange coupled tri-layer free layer (25) and the reference layer (27) are in opposite directions as shown by the arrows. The cell temperature, T, is less than the Curie temperature $T_C$, of the coupling valve layer (22) so the free layer (25) is in a stable exchange coupled mode. The write operation is now required to switch the free layer magnetization so that it is in the same direction as that of the reference layer.

The switching current, $I_s$, (shown as a downward directed arrow in FIG. 7a) needs to flow from bit line to ground as in FIG. 5, hence towards the reference layer (27) from the free layer (25). Thus the electrons (45) move in the opposite direction, from reference layer to free layer. The electron is polarized in the direction of the reference layer's magnetization and it will deposit its spin torque on second storage layer (24) of the free layer since its magnetization is in an opposite direction to that of the reference layer. The switching current will also generate heat in the tunneling layer (26), which will be dissipated to the coupling valve layer (22) through layer (24) of the free layer. As the Curie temperature of the coupling valve layer is exceeded, the exchange coupling effect goes to zero, decoupling the second storage layer (24) from the first storage layer (20).

Referring to FIG. 7b, the spin torque of the switching current acts only on the decoupled magnetization (arrow) of the second storage layer (24), which has less than half of the total volume magnetization ($M_sV$) of the entire tri-layered free layer (25). Thus the spin torque switches the magnetization of layer (24) with the help of the magnetostatically coupled layer (20), which predisposes layer (24) to form an antiparallel configuration with layer (20). Once layer (24) has its magnetization switched in direction, the electrons (45) passing through it will be spin polarized in the opposite direction to that layer's present magnetization, which is now parallel to that of the reference layer, but opposite to the magnetization of layer (20).

Referring to FIG. 7c, the torque of the electron now acts on the magnetization of layer (20) and reverses it so that it is now in the direction of the magnetization of layer (24). As the temperature of the cell falls back below the Curie temperature, the magnetizations of layers (20) and (24) are once again exchange coupled in a stable parallel, ferromagnetic configuration which is now opposite to their original direction as shown in FIG. 7a. In principle, the free layer can be composed of N periods of alternating [magnetic layer/coupling layer] pairs (see FIG. 6b), so the $I_c$ can be reduced by a factor of N.

BRIEF DESCRIPTION OF THE DRAWINGS

FIG. 1a and FIG. 1b are drawings of an exemplary prior art MTJ cell, wherein FIG. 1a shows an overhead view of an in-plane configuration of magnetizations and FIG. 1b shows a side cross-sectional view of the same configuration of magnetizations.

FIG. 2 is a schematic drawing of a side cross-sectional view of an exemplary prior art MTJ cell with a perpendicular-to-plane configuration of magnetized layers.

FIG. 3 is a graphical illustration showing the resistance of an MTJ cell, such as that in FIG. 1a or FIG. 1b, as a function of an applied switching field.

FIG. 4 is a schematic representation of a prior-art MTJ MRAM device formed as an array of MTJ cells located at the junction of orthogonal word and bit lines.

FIG. 5 is a schematic illustration showing a cross-sectional view of two prior art spin torque transfer (STT) MTJ cells formed contacting a single bit line and accessed by external circuitry.

DESCRIPTION OF THE PREFERRED EMBODIMENTS

The preferred embodiment of the present invention is an MRAM device of the spin-transfer MTJ variety, incorporating an STT MTJ cell element, in which the free layer is formed as a pair of magnetic (preferably ferromagnetic) layers, called herein magnetic storage layers, coupled by a coupling valve layer. In this construction the preferable ferromagnetic layers are strongly exchanged coupled in a parallel (ferromagnetic) magnetization configuration when the cell temperature is below the Curie temperature of the coupling valve layer, but are magnetostatically coupled in an anti-parallel configuration of magnetizations, when the cell temperature is above the Curie temperature. The exchange coupled state is advantageous for storing and reading information, where the magnetization of the free layer should be highly stable, whereas the magnetostatically coupled state is advantageous for the writing of information, where the magnetization of the free layer is required to be changed and the magnetostatic coupling disposes the magnetizations to be anti-parallel. Since the cell temperature can be increased by the passage of conduction electrons through a tunneling barrier layer, the free layer can be changed from the exchange coupled configuration to the magnetostatically coupled configuration in a manner that is advantageous to the processes of storing/reading and writing information. In another embodiment, the cell free layer is a multi-period lamination of a [ferromagnetic layer/coupling valve layer] bi-layer, whereby the critical switching current, $I_c$, is reduced by a factor of the number of periods.

Figure 6A:
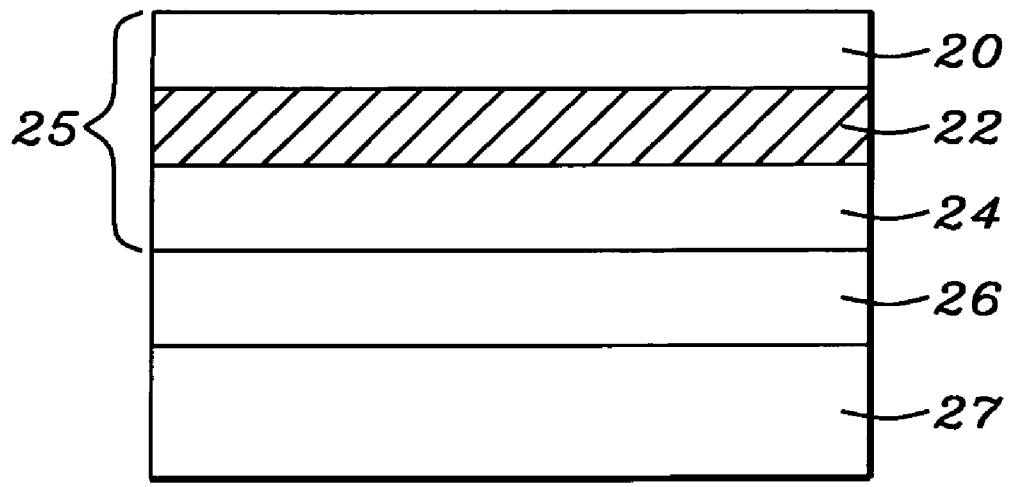
FIG. 6a is a schematic illustration of a side cross-sectional view of a STT MTJ cell utilizing the coupled valve free layer construction of the present invention in a tri-layered form comprising two ferromagnetic layers sandwiching a coupling valve layer.

To achieve these embodiments, the coupling valve layer is made of a magnetic material having a low Curie temperature, $T_C$, ranging between approximately 85° C. and 300° C. Referring back to FIG. 6a, the magnetic layers (20) and (24) forming the coupled free layer (25) are made of Co, Fe, Ni, or their alloys, which can be engineered to have a high Curie temperature ($T_C$ of pure Ni, pure bcc Co and pure Fe is, respectively, approximately 358° C., 1130° C. and 770° C.). These ferromagnetic layers are preferably formed within a thickness range of 0.5 and 5.0 nanometers. The coupling valve layer (22) can be any conducting semiconductor material or weak insulating magnetic material with a Curie temperature between approximately 850° C. and 300° C. Some exemplary materials are Ni, Fe, Co or alloys of the form XY, where X is Ni, Fe or Co and Y includes Mo, Pt, V, Cr, Si, Al, Zn, Mn, Cu, Pd, C, Ce, B, S and P. Preferably, the thickness range of the coupling valve layer is between 0.5 and 2 nanometers. Although other inventions make use of novel alloys for the formation of free layers, see eg. Gill, U.S. Pat. No. 6,665,155, these inventions are seeking properties such as magnetostriction, not the range of Curie temperatures that are required for the present invention.

Figure 8:
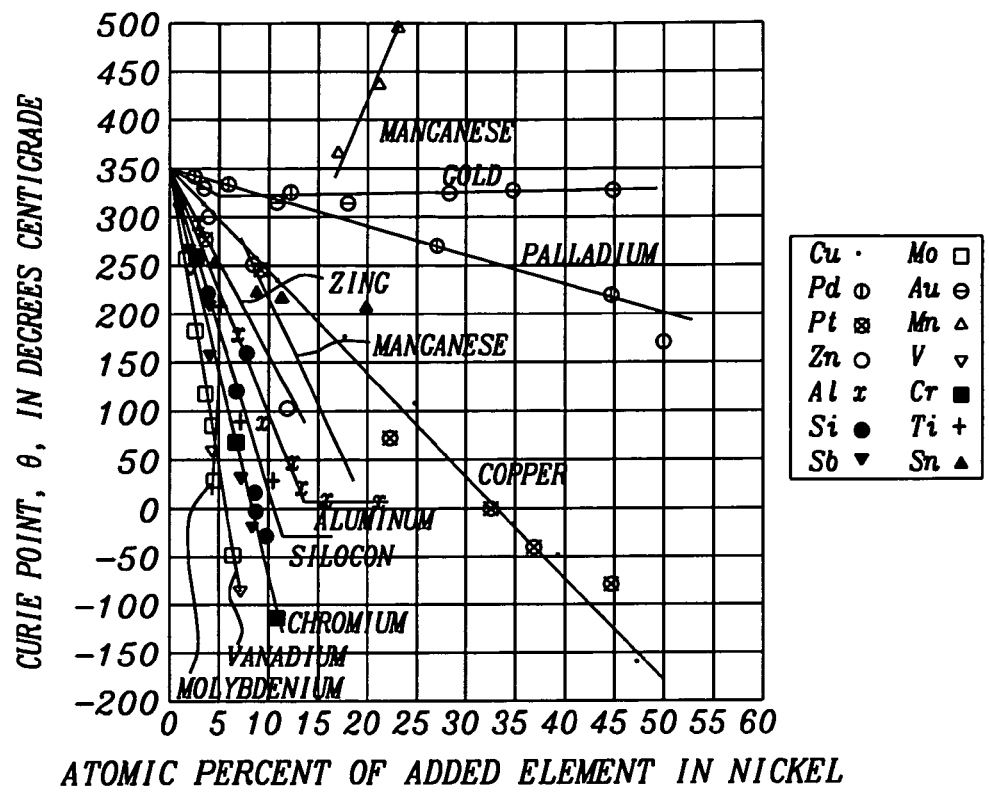
FIG. 8 is a graph plotting the Curie temperature of alloys of the form NiY, as a function of the atom-percent of Ni in the alloy.
Figure 9:
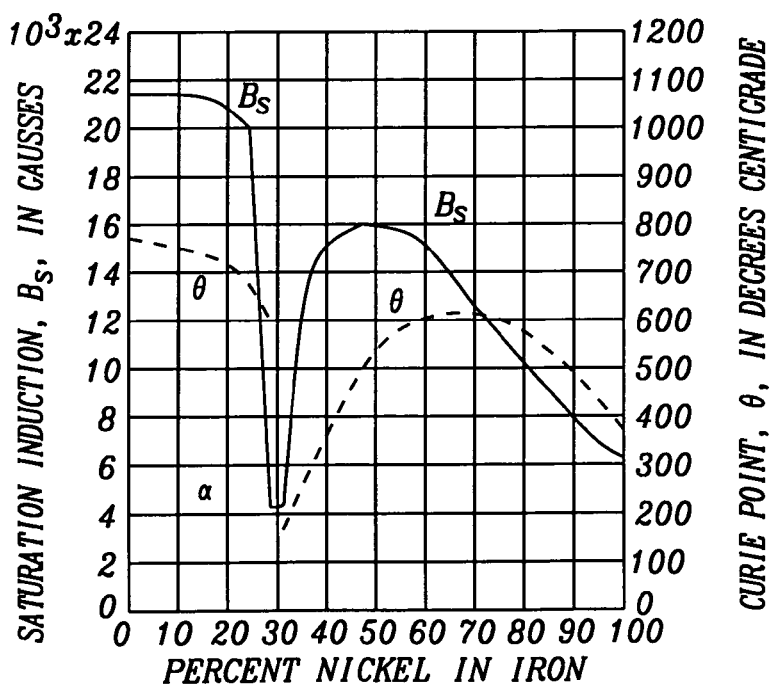
FIG. 9 is a graph plotting the Curie temperature of a NiFe alloy as a function of the atom-percent of Ni.

Referring to FIG. 8, there is shown a graph of the Curie temperature of alloys of the form NiY plotted against the atom-percentage of Ni in the alloy. Referring also to FIG. 9, there is shown a graph of the variation of the Curie temperature of a NiFe alloy as a function of the atom-percent of Ni in the alloy. The NiFe alloy with atom percent of Ni around 30% to 35% can also have a Curie temperature between approximately 120° C. and 250° C. as shown in the graph. Other low Curie temperature materials include rare earth alloys like CrTe (the Curie temperature of Cr is approximately 100° C.), magnetic oxides like $BeFeO_4$ (the Curie temperature being approximately 190° C.), $Er_2O_3*Fe_2O_3$ (the Curie temperature being approximately 275° C.) and half metals like the Heusler alloys $Cu_2MnX$ (X=Al, In, Sn, Ga) or CoCrFeAl.

Figure 10:
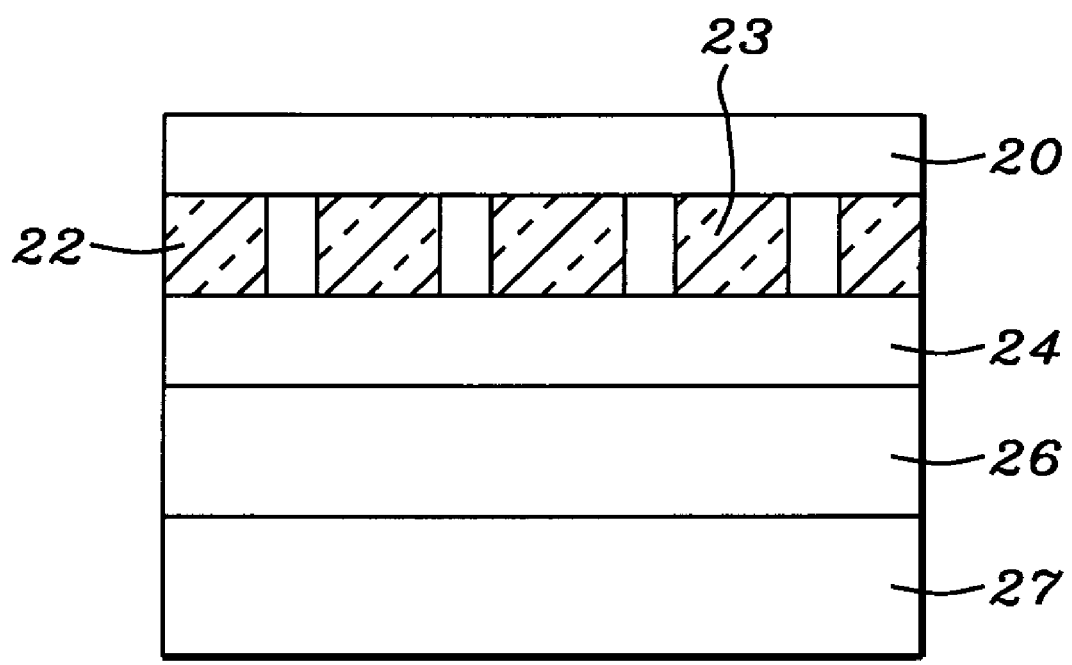
FIG. 10 is a schematic illustration of a side cross-sectional view of an STT MTJ cell having a coupling valve layer fabricated as an insulating matrix in which are formed magnetic nano-conducting channels.

Another preferred embodiment is to have the coupling valve layer fabricated as a matrix of Co, Fe, Ni or its alloys, inside an insulator like an oxide or a nitride, including $Al_2O_3$, $SiO_2$, MgO, $ZrO_2$, $HfO_2$, ZnO, SiN, AlN and GaN, to form magnetic nano-conducting channels as illustrated schematically in FIG. 10. The magnetic storage layers (20) and (24) are exchange coupled through the nano-channels (23) in the coupling layer (22) during storage and reading operations. During the write operation, as the writing current flows through the MTJ cell, the enhanced current density raises the temperature of the nano-channels to either be above the Curie temperature of the nano-channel material or above a critical temperature at which the nano-channels become paramagnetic or super-paramagnetic, whereby the exchange coupling between the ferromagnetic layers is switched off. Thus, the coupling valve effect is achieved.

Figure 6B:
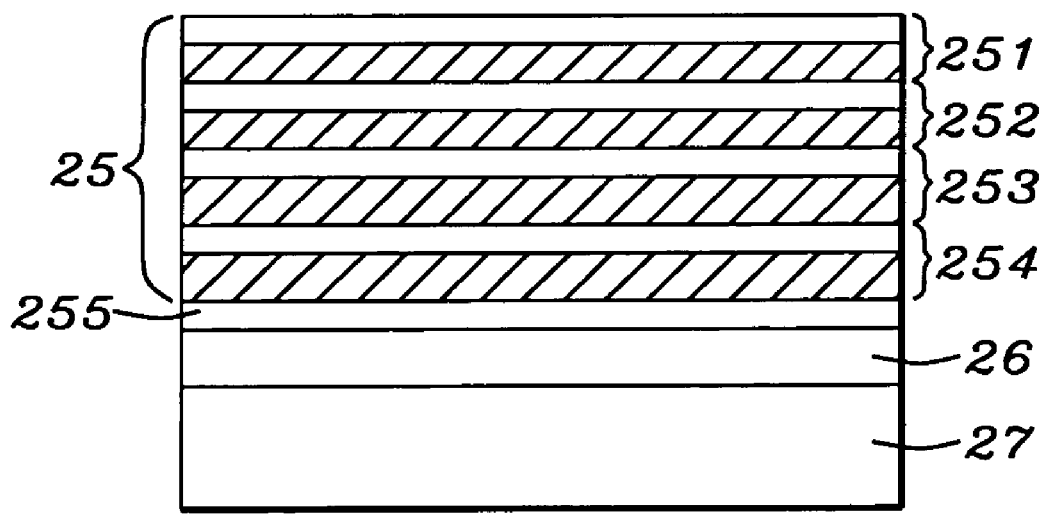
FIG. 6b is a schematic illustration of the cell of FIG. 6a wherein the free layer is now a periodically repeated lamination of ferromagnetic layers and coupling layers.
Figure 7A:
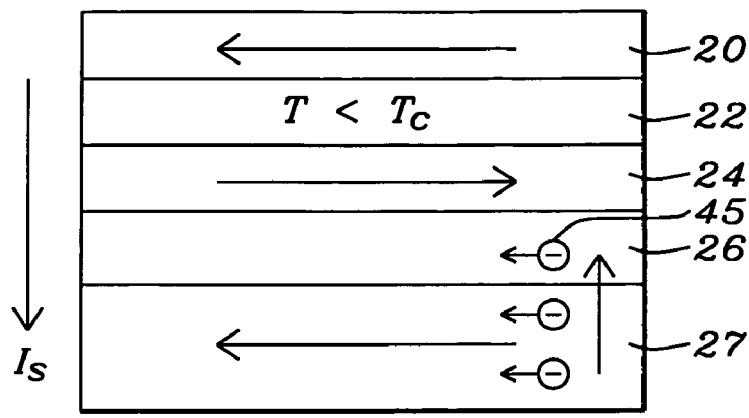
FIG. 7a, FIG. 7b and FIG. 7c are schematic illustrations of the action of a switching current on the coupled valve STT MTJ cell (or GMR cell) of the present invention.
Figure 7B:
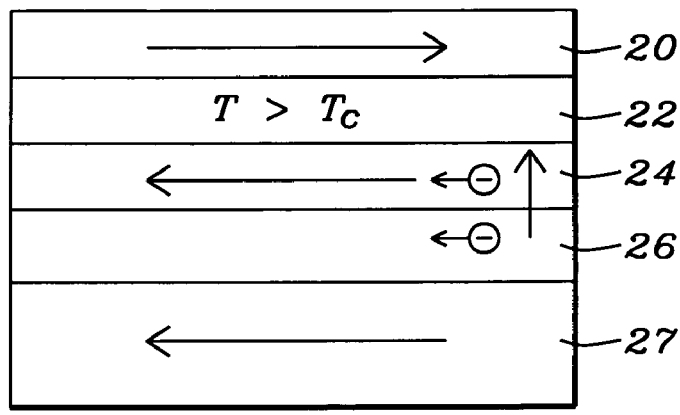
Figure 7C:
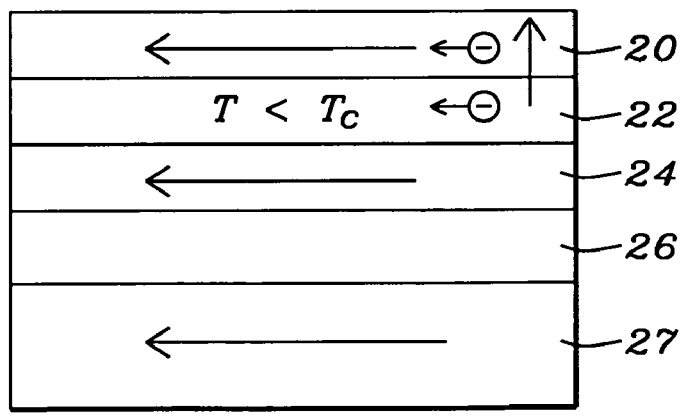

The above two embodiments can be implemented either in the context of in-plane layer magnetizations or perpendicular-to-plane magnetizations. In addition, the embodiments can be extended to the configuration of FIG. 6b, in which [magnetic storage layer/coupling layer] pairs are repeated periodically N and finally capped with a final magnetic storage layer, to form an N-fold multilayered laminated free layer that comprises N tri-layers of two magnetic storage layers separated by a coupling valve layer in which the critical current is thereby reduced by a factor of N.

As is finally understood by a person skilled in the art, the preferred embodiments of the present invention are illustrative of the present invention rather than limiting of the present invention. Revisions and modifications may be made to methods, materials, structures and dimensions employed in forming and providing a spin transfer MTJ MRAM device including a free layer formed as a lamination of magnetically coupled layers wherein the form of coupling varies between exchange coupling and magnetostatic coupling as a function of a layer temperature and whereby a process of writing data onto said cell is accomplished at a smaller switching current, while still forming and providing such a device and its method of formation in accord with the spirit and scope of the present invention as defined by the appended claims.

What is claimed is:

1. A spin torque transfer (STT) MTJ or STT GMR MRAM device comprising:

an STT MTJ or STT GMR cell including a non-magnetic intermediate layer formed between a magnetically pinned reference layer having a fixed magnetization and a magnetically free layer having a variable magnetization;

wherein said free layer is a laminated structure comprising a first and second magnetized storage layer separated by a coupling valve layer, wherein said first and second magnetized storage layers can be either exchange coupled by said coupling valve layer with each of their magnetizations being parallel or wherein said first and second magnetized storage layers can be magnetostatically coupled across said coupling valve layer, wherein said magnetostatic coupling favors an anti-parallel configuration of each of their magnetizations.

2. The device of claim 1 wherein said coupling valve layer has a Curie temperature and wherein said first and second magnetized layers are exchange coupled when a temperature of said coupling valve layer is below said Curie temperature and wherein said two magnetized layers are magnetostatically coupled when a temperature of said coupling valve layer is above said Curie temperature.

3. The device of claim 1, wherein said cell stores information when said first and second magnetized storage layers are exchange coupled with said parallel magnetizations both in a thermally stable configuration and wherein said parallel magnetizations are either parallel to or anti-parallel to said magnetization of said reference layer.

4. The device of claim 1 wherein information is written on said cell by a writing operation that reverses the direction of said first and second magnetically parallel exchange coupled magnetized storage layers.

5. The device of claim 4 wherein said writing operation includes the switching off of the exchange coupling between said first and second magnetized storage layers.

6. The device of claim 4 wherein said writing operation comprises:

sending a critical flow of electrons through said magnetized reference layer, towards said tunneling barrier layer, whereby a spin of said electrons is preferentially oriented by the magnetization of said reference layer in the direction of the magnetization of said reference layer; thereby heating said MTJ cell element by the dissipation of energy of said electrons as they pass through said intermediate layer, thereby causing the Curie temperature of said coupling valve layer to be exceeded; thereby reducing to zero the exchange coupling between said ferromagnetic storage layers thereby causing them to be magnetostatically coupled; and reversing the direction of magnetization of said first magnetic storage layer which is immediately adjacent to said intermediate layer, by means of a spin torque transfer mechanism between said polarized electrons and the magnetization of said first magnetic storage layer and with the assistance of said magnetostatic coupling to the magnetization of said second magnetic storage layer; whereupon said electrons then pass through said coupling valve layer and into said second magnetic storage layer, reversing the magnetization of said second magnetic storage layer by means of said spin transfer of torque and causing said magnetization to be parallel to the magnetization of said first magnetic storage layer; and then the temperature of said cell falls below said Curie temperature and the free layer is again exchange coupled in a stable manner.

7. The device of claim 1 wherein all magnetizations are in the film plane of said magnetized layers.

8. The device of claim 1 wherein all magnetizations are perpendicular to the planes of said magnetized layers.

9. The device of claim 1 wherein said intermediate layer is a tunneling barrier layer formed as a layer of oxide of Al, Mg, Zr, Hf or laminations thereof and the cell is an STT MTJ cell.

10. The device of claim 1 wherein said intermediate layer is a layer of the transitional metal Cu. Ag, Au, Cr, Hf, Zr or laminations thereof and the cell is an STT GMR cell.

11. The device of claim 1 wherein said pinned reference layer is an antiferromagnetically coupled laminated layer comprising two ferromagnetic layers coupled by a metal layer of Ru or Rh and wherein one of said ferromagnetic layers is pinned by an adjacent layer of antiferromagnetic material.

12. The device of claim 1 wherein said laminated free layer structure includes N identical magnetic storage layers and N-1 identical coupling valve layers and is formed as N-1 identical, periodically repeating tri-layers, wherein each tri-layer comprises two magnetic storage layers separated by a coupling valve layer.

13. The device of claim 1 wherein said coupling valve layer is a layer of material having a Curie temperature above approximately 300° C.

14. The device of claim 12 wherein each said coupling valve layer is a layer of magnetic material having a Curie temperature above approximately 300° C.

15. The device of claim 1 wherein said coupling valve layer is a layer of magnetic material having a Curie temperature between approximately 850° C. and 300° C.

16. The device of claim 12 wherein each said coupling valve layer is a layer of magnetic material having a Curie temperature between approximately 850° C. and 300° C.

17. The device of claim 1 wherein said coupling valve layer is a layer of nano-particles that are magnetic and electrically conducting, suspended in a matrix of insulating material.

18. The device of claim 12 wherein each said coupling valve layer is a layer of nano-particles that are magnetic and electrically conducting, suspended in a matrix of insulating material.

19. The device of claim 1 wherein the coupling valve layer is a layer of the magnetic material Ni, Co, Fe or their alloys, said material being doped with the addition of the elements Mo, Pt, V, Cr, Si, AL, Zn, Mn, Cu, Pd, C, Ce, B, S or other elements whose addition will lower the Curie temperature of the layer.

20. The device of claim 12 wherein each said coupling valve layer is a layer of the magnetic material Ni, Co, Fe or their alloys, said materials being doped with the addition of the elements Mo, Pt, V, Cr, Si, AL, Zn, Mn, Cu, Pd, C, Ce, B, S or other elements whose addition will lower the Curie temperature of the layer.

21. The device of claim 1 wherein said coupling valve layer is a layer of the rare earth alloy CrTe.

22. The device of claim 12 wherein each said coupling valve layer is a layer of the rare earth alloy CrTe.

23. The device of claim 1 wherein said coupling valve layer is a layer of the half metal material including Heusler alloys of the form $Cu_2MnX$, wherein X is Al, In, Sn or Ga, or the material CoCrFeAl.

24. The device of claim 12 wherein each said coupling valve layer is a layer of the half metal material including Heusler alloys of the form $Cu_2MnX$, wherein X is Al, In, Sn or Ga, or the material CoCrFeAl.

25. The device of claim 1 wherein said coupling valve layer is a layer of magnetic oxide, including the magnetic oxides $BeFeO_4$ and $Er_2O_3*Fe_2O_3$.

26. The device of claim 12 wherein each said coupling valve layer is a layer of magnetic oxide, including the magnetic oxides $BeFeO_4$ and $Er_2O_3*Fe_2O_3$.

27. The device of claim 17 wherein said insulating material is an oxide or a nitride, including $Al_2O_3$, $SiO_2$, MgO, $ZrO_2$, $HfO_2$, ZnO, SiN, AlN and GaN.

28. The device of claim 18 wherein said insulating material is an oxide or a nitride, including $Al_2O_3$, $SiO_2$, MgO, $ZrO_2$, $HfO_2$, ZnO, SiN, AlN and GaN.

29. The device of claim 1 wherein said coupling valve layer is formed to a thickness between approximately 0.5 and 2.0 nanometers.

30. The device of claim 12 wherein each said coupling valve layer is formed to a thickness between approximately 0.5 and 2.0 nanometers.

31. The device of claim 1 wherein each of said magnetic storage layers is a layer formed of Ni, Fe, Co or their alloys and is formed to a thickness between approximately 0.5 and 5.0 nanometers.

32. The device of claim 12 wherein each of said magnetic storage layers is a layer formed of Ni, Fe, Co or their alloys and is formed to a thickness between approximately 0.5 and 5.0 nanometers.

33. A method of forming a spin torque transfer (STT) MTJ or STT GMR MRAM device comprising:
providing a substrate;
forming a STT MTJ or GMR cell on said substrate, the formation of either of said cells comprising:
forming a magnetically pinned reference layer on said substrate;
forming a non-magnetic intermediate layer on said reference layer;
forming a magnetically free layer on said intermediate layer; wherein the formation of said free layer further comprises:
forming a first, magnetized storage layer on said intermediate layer;
forming a coupling valve layer on said second magnetized ferromagnetic storage layer;
forming a second magnetized storage layer on said coupling valve layer;
wherein said first and second magnetic storage layers are either exchange coupled by said coupling valve layer with their magnetizations being parallel or wherein said first and second magnetized storage layers are magnetostatically coupled across said coupling valve layer, which favors an anti-parallel configuration of their magnetizations.

34. The method of claim 33 wherein said coupling valve layer is formed of a material having a Curie temperature and wherein said first and second magnetized ferromagnetic layers are exchange coupled when a temperature of said coupling valve layer is below said Curie temperature and wherein said two magnetized layers are magnetostatically coupled when a temperature of said coupling valve layer is above said Curie temperature.

35. The method of claim 33 wherein all magnetizations are in the film plane of said magnetized layers.

36. The method of claim 33 wherein said intermediate layer is a tunneling barrier layer formed as a layer of oxide of Al, Mg, Zr, Hf or laminations thereof and the cell is an MTJ cell.

37. The method of claim 33 wherein said intermediate layer is a layer of the transitional metal Cu. Ag, Au, Cr, Hf, Zr or laminations thereof and the cell is a GMR cell.

38. The method of claim 33 wherein said coupling valve layer is formed as a layer of material having a Curie temperature above approximately 300° C.

39. The method of claim 33 wherein said coupling valve layer is a layer of magnetic material having a Curie temperature between approximately 85° C. and 300° C.

40. The method of claim 33 wherein said coupling valve layer is a layer of nano-particles that are magnetic and electrically conducting, suspended in a matrix of insulating material.

41. The method of claim 33 wherein the coupling valve layer is a layer of the magnetic material Ni, Co, Fe or their alloys, said material being doped with the addition of the elements Mo, Pt, V, Cr, Si, AL, Zn, Mn, Cu, Pd, C, Ce, B, S or other elements whose addition will lower the Curie temperature of the layer.

42. The method of claim 33 wherein said coupling valve layer is a layer of the rare earth alloy CrTe.

43. The method of claim 33 wherein said coupling valve layer is a layer of the half metal material including Heusler alloys of the form $Cu_2MnX$, wherein X is Al, In, Sn or Ga, or the material CoCrFeAl.

44. The method of claim 33 wherein said coupling valve layer is a layer of magnetic oxide, including the magnetic oxides $BeFeO_4$ and $Er_2O_3*Fe_2O_3$.

45. The method of claim 40 wherein said insulating material is an oxide or a nitride, including $Al_2O_3$, $SiO_2$, MgO, $ZrO_2$, $HfO_2$, ZnO, SiN, AlN and GaN.

46. The method of claim 40 wherein said coupling valve layer is formed to a thickness between approximately 0.5 and 2.0 nanometers.

47. The method of claim 33 wherein said coupling valve layer is formed to a thickness between approximately 0.5 and 2.0 nanometers.

48. The method of claim 33 wherein each of said magnetic storage layers is a layer formed of Ni, Fe, Co or their alloys and is formed to a thickness between approximately 0.5 and 5.0 nanometers.

49. The method of claim 33 wherein the formation of said free layer further includes the formation of N-2 additional identical magnetic storage layers and N-1 additional identical coupling valve layers to form a laminated multilayer comprising N identical periodically repeating tri-layers, wherein each tri-layers comprises two magnetic storage layers separated by a coupling valve layer and wherein said Nth trilayer comprises the $N-1^{st}$ magnetic storage layer, on which is formed the N-1 st coupling valve layer, on which is formed the Nth magnetic storage layer, thereby completing the formation.

50. The method of claim 33 wherein said coupling valve layer is a layer of magnetic material having a Curie temperature above approximately 300° C.

51. The method of claim 33 wherein all magnetizations are perpendicular to the planes of said magnetized layers.

* * * * *

UNITED STATES PATENT AND TRADEMARK OFFICE
CERTIFICATE OF CORRECTION

PATENT NO. : 7,929,370 B2  Page 1 of 1
APPLICATION NO. : 12/313708
DATED : April 19, 2011
INVENTOR(S) : Tai Min It is certified that error appears in the above-identified patent and that said Letters Patent is hereby corrected as shown below:

Title page, item (75) Inventors, reads Inventor "Tai Min, Milpitas, CA (US)" and replace with -- Tai Min, San Jose, CA (US) --.

Signed and Sealed this
Twenty-eighth Day of June, 2011

David J. Kappos
*Director of the United States Patent and Trademark Office*